(12) United States Patent
Beach et al.

(10) Patent No.: US 7,728,355 B2
(45) Date of Patent: Jun. 1, 2010

(54) NITROGEN POLAR III-NITRIDE HETEROJUNCTION JFET

(75) Inventors: Robert Beach, Altadena, CA (US); Zhi He, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 127 days.

(21) Appl. No.: 11/649,014

(22) Filed: Jan. 3, 2007

(65) Prior Publication Data
US 2007/0164314 A1 Jul. 19, 2007

Related U.S. Application Data

(60) Provisional application No. 60/755,394, filed on Dec. 30, 2005.

(51) Int. Cl.
*H01L 29/739* (2006.01)
*H01L 31/0304* (2006.01)

(52) U.S. Cl. .............. 257/194; 257/192; 257/E29.246; 257/E29.253

(58) Field of Classification Search ............... 257/192, 257/85, 194, E29.246–29.253
See application file for complete search history.

(56) References Cited

U.S. PATENT DOCUMENTS

| 5,929,467 | A   * | 7/1999 | Kawai et al. ............ 257/192 |
| 7,002,179 | B2 * | 2/2006 | Nakahara ................ 257/76 |
| 2003/0020092 | A1 * | 1/2003 | Parikh et al. ............ 257/192 |
| 2003/0102482 | A1 * | 6/2003 | Saxler ................... 257/85 |
| 2005/0189559 | A1 * | 9/2005 | Saito et al. ............. 257/189 |
| 2009/0085065 | A1 * | 4/2009 | Mishra et al. ........... 257/194 |

* cited by examiner

*Primary Examiner*—Fernando L Toledo
*Assistant Examiner*—Mamadou Diallo
(74) *Attorney, Agent, or Firm*—Farjami & Farjami LLP

(57) ABSTRACT

An N-polar III-nitride heterojunction JFET which includes a P-type III-nitride body under the gate electrode thereof.

18 Claims, 3 Drawing Sheets

US 7,728,355 B2

NITROGEN POLAR III-NITRIDE HETEROJUNCTION JFET

RELATED APPLICATION

This application is based on and claims priority to the of U.S. Provisional Application Ser. No. 60/755,394, filed on Dec. 30, 2005, entitled Nitrogen Polar III-N HJFET, to which a claim of priority is hereby made and the disclosure of which is incorporated by reference.

DEFINITIONS

III-nitride refers to a semiconductor alloy form the AlInGaN system, which includes, but is not limited, doped or undoped GaN, AlGaN, InGaN, AlInGaN, AlN, InN, or the like alloy.

N-polar as used herein refers to Nitrogen-polar. For example, N-polar III-nitride includes an N-polar semiconductor alloy such as N-polar GaN.

BACKGROUND AND SUMMARY OF THE INVENTION

The present invention relates to III-nitride power semiconductor devices.

The large dielectric breakdown field (>2.2 MV/cm) and the high current density of the two dimensional electron gas (2-DEG) in III-nitride heterojunction semiconductor devices make them attractive for power applications.

One known III-nitride heterojunction power semiconductor device is a high electron mobility transistor (HEMT). A desirable variation of a HEMT is a normally-off HEMT; i.e. a HEMT which does not allow for conduction of current (except for minute leakage current) in the absence of an appropriate voltage to its gate electrode.

FIG. 1 of U.S. patent application Ser. No. 11/537,304 (assigned to the assignee of the present application) illustrates a normally-off III-nitride power semiconductor device, which includes a III-nitride semiconductor stack. The stack so disclosed includes an N-polar GaN layer, an N-polar AlGaN layer, an N-polar GaN layer, and an N-polar AlGaN layer disposed below the gate electrode thereof, which renders the device normally off.

Another method for obtaining a normally off state is to provide a P-type body over the gate region. Such an arrangement is shown in Saito et al., U.S. 7,038,252. Specifically, Saito et al. discloses a number of devices having insulated gates over the P-type body, which is disposed on the barrier layer of the active heterojunction of the device.

The presence of a PN junction in devices proposed by Saito et al. leads to gate leakage.

It is an object of the present invention to provide a normally off III-nitride semiconductor device which does not suffer from the drawbacks of the prior art.

A III-nitride power semiconductor device according to the present invention includes an N-polar III-nitride body having an N-polar face, a III-nitride buffer layer on the N-polar face, a III-nitride heterojunction that includes III-nitride barrier layer, and a III-nitride channel layer, the III-nitride heterojunction including a two-dimensional electron gas (2DEG), a first power electrode disposed over the heterojunction and coupled to the 2DEG, a second power electrode disposed over the heterojunction and coupled to the 2DEG, and a gate arrangement disposed over the heterojunction between the first and the second power electrode and including a P-type III-nitride body, and a gate contact, said P-type III-nitride body being disposed between the heterojunction and the gate contact.

According to one aspect of the present invention the barrier layer is disposed over the buffer layer and the channel layer is disposed over the barrier layer. Consequently, the PN junction is formed at the junction of the P-type III-nitride body and the channel layer resulting in confinement of electrons in the channel layer between the body and the barrier layers. This combination of doping and band gap alignments keeps the carriers from moving into the buffer layer during reverse bias conditions. By using an N-polar configuration, a barrier layer of larger band gap than the channel layer is achieved without the formation of a parasitic 2-dimensional electron gas at the interface between the barrier and the buffer layers.

In the preferred embodiment, the barrier layer is comprised of AlInGaN, and the channel layer is comprised of GaN. AlInGaN can be made with a larger band gap than the conventional material for the barrier layer, namely AlGaN, whereby leakage can be further reduced. That is, InAlGaN allows for a large barrier to electron injection, thereby preventing gate leakage. The P-type III-nitride body may be P-type GaN, or P-type AlInGaN. A device according to the preferred embodiment may further include a substrate, and a transition layer disposed between the substrate and the N-polar III-nitride body. The transition layer may be AlN or an oxide, while the substrate may made of silicon, SiC, sapphire, or a III-nitride material such as GaN.

A device according to the present invention is preferably a JFET. A JFET according to the present invention is more suitable for lower frequency applications (e.g. MHz range) because a PN junction under an insulated gate will result in accumulation and untimely and uncontrollable turning on/off of the device at low frequencies (e.g. MHz) leading to unacceptable circuit performance. In a device according to the preferred embodiment, the frequency dependent effects of an insulator above a p-type body is avoided.

A device according to the present invention may further include spacer field plates each disposed between the gate arrangement and a respective power electrode.

Other features and advantages of the present invention will become apparent from the following description of the invention which refers to the accompanying drawings.

DETAILED DESCRIPTION OF THE FIGURES

Figure 1:
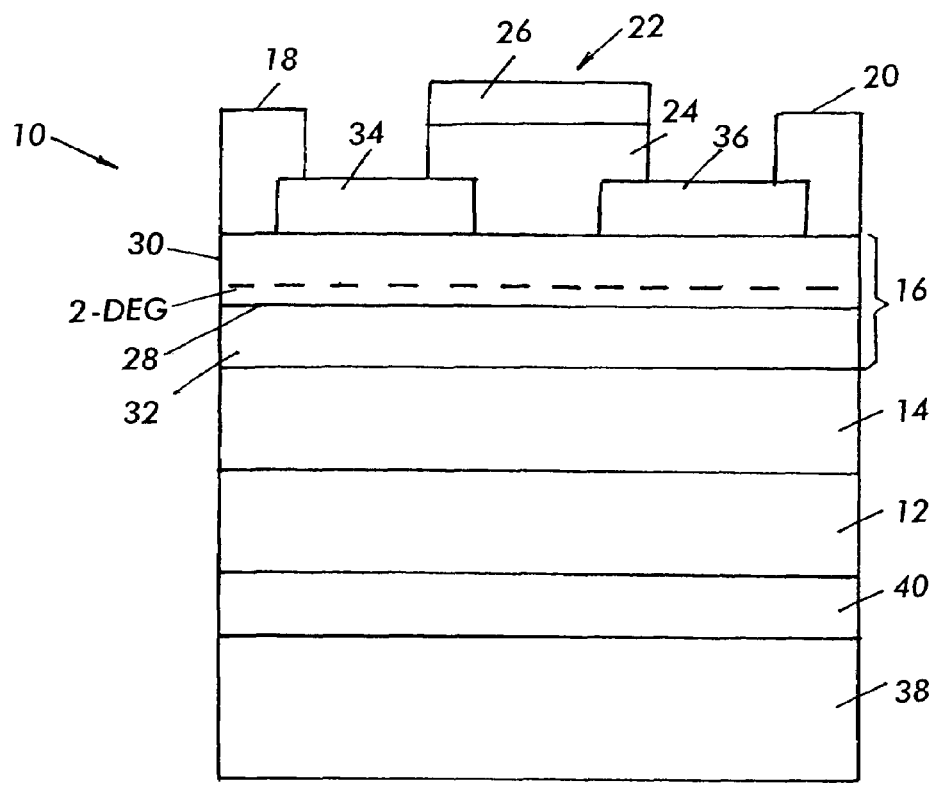
FIG. 1 illustrates a cross-sectional view of a portion of a III-nitride semiconductor device according to the present invention.

Referring to FIG. 1, a III-nitride power semiconductor device 10 according to the present invention includes an N-polar III-nitride body 12 (e.g. N-polar GaN), III-nitride buffer layer 14 (e.g. GaN buffer layer) grown on N-polar III-nitride body 12, a III-nitride heterojunction 16, which includes a 2DEG formed on III-nitride buffer layer 14, first power electrode 18 (e.g. source electrode) disposed over III-nitride heterojunction 16 and coupled electrically to the 2DEG through an ohmic connection to heterojunction 16, second power electrode 20 (e.g. drain electrode) disposed over III-nitride heterojunction 16 and coupled electrically to the 2DEG through an ohmic connection to heterojunction 16, a gate arrangement 22 disposed over heterojunction 16 between first (18) and second (20) electrodes.

According to one aspect of the present invention, gate arrangement 22 includes a p-type III-nitride body 24 disposed over heterojunction 16, and gate electrode 26 disposed over and coupled to p-type III-nitride body 24. P-type III-nitride body may be formed from P-type GaN or P-type AlGaN.

Note that III-nitride heterojunction 16 includes III-nitride barrier layer 28, which is preferably formed of an alloy of AlInGaN and III-nitride channel layer 30, which is preferably formed of N-type GaN. Further note that to form III-nitride heterojunction 16 barrier layer 28 and channel layer 30 are selected to have different bandgaps, or different in-plane lattice constants. Note also that the thickness and the composition of barrier layer 28 and channel layer 30 are selected to generate the 2DEG inside channel layer 30 near the heterojunction 32 of the two bodies 28, 30.

Device 10 further includes spacer field plates 34, 36 each disposed over heterojunction 16, and preferably extending at least partially under gate arrangement 22, and at least partially under a portion of respective power electrode 18, 20, whereby each spacer field plate 34, 36 is disposed between a power electrode 18, 20 and gate arrangement 22 (e.g. spacer field plate 34 between gate arrangement 22 and first power electrode 18, and spacer field plate 36 between gate arrangement 22 and second power electrode 20).

Figure 2:
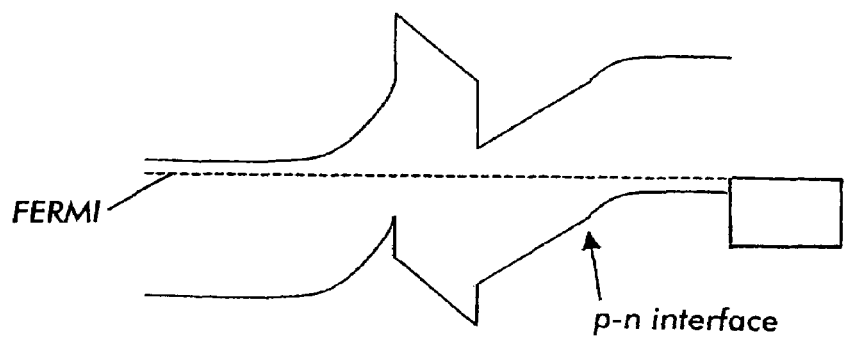
FIG. 2 illustrates a band diagram for a region under the gate of a device according to the present invention.

Referring to FIG. 2, which illustrates the band diagram under gate arrangement 22, the PN junction formed by the contact of P-type III-nitride body 24 and III-nitride channel layer 30 results in a depletion region which extends through the 2DEG, whereby the 2DEG is interrupted, and device 10 is rendered normally off. The application of an appropriate voltage to gate contact 26 restores the 2DEG, thereby allowing current to travel through the 2DEG between electrodes 18, 20.

Figure 3:
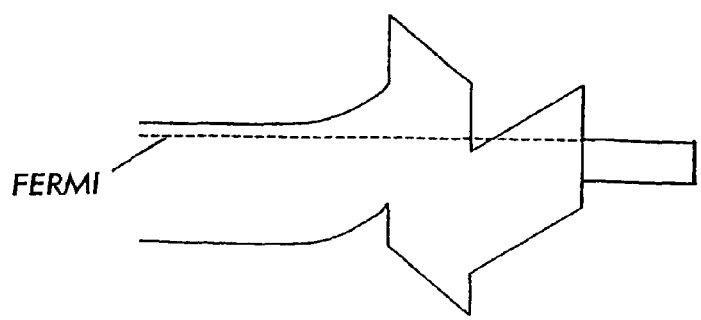
FIG. 3 illustrates a band diagram for a region under the power electrodes of a device according to the present invention.

Referring to FIG. 3, which illustrates a band diagram for regions below electrodes 18, 20, it can be seen that under electrodes 18, 20 and the region below spacer bodies 34, 36 the condition band lies below the Fermi level resulting in accumulation and a high mobility 2DEG.

Device 10 may be formed over a substrate 38 made from a non-native material such as Silicon, SiC, or Sapphire. When non-native materials are used it may be necessary to provide a transition layer 40 between N-polar III-nitride body 12 and substrate 38. Transition layer 40 may be an oxide or a III-nitride material such as AlN.

Note that it would also be possible to use a native material (i.e. material from the III-nitride system) for substrate 38. For example, a GaN substrate may be used, which would eliminate the need for a transition layer 40, and would allow for N-polar III-nitride body 12 to be formed directly on substrate 38.

Figure 4A:
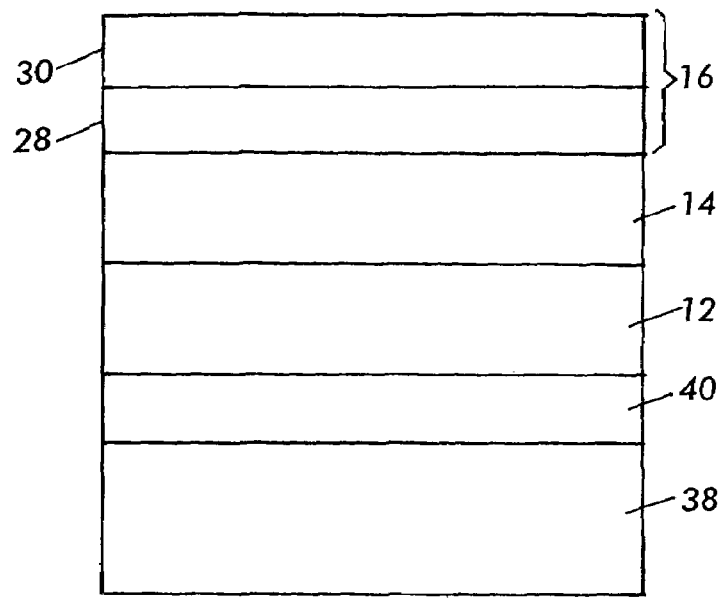
FIGS. 4A-4D illustrate selected steps in a process for fabricating a device according to the present invention.
Figure 4B:
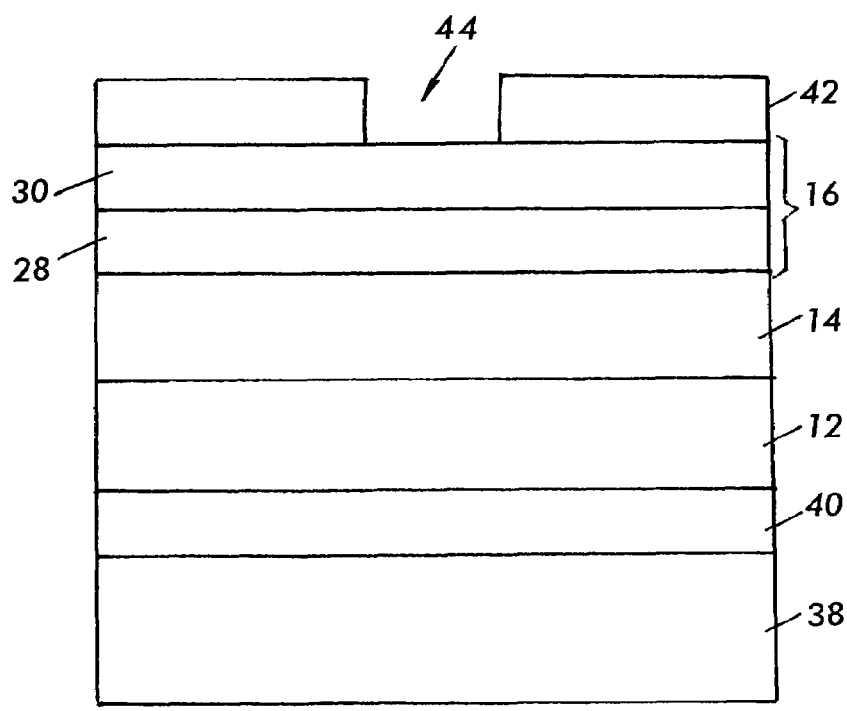

Referring now to FIGS. 4A-4D, to fabricate a device according to the present invention a stack that includes substrate 38, transition layer 40, N-polar III-nitride body 12, buffer layer 14, and III-nitride heterojunction 16 (see FIG. 4A) receives through deposition or the like step a layer of material 42 which is patterned through photolithograph or the like to include an opening 44 over channel layer 30 as illustrated by FIG. 4B.

Figure 4C:
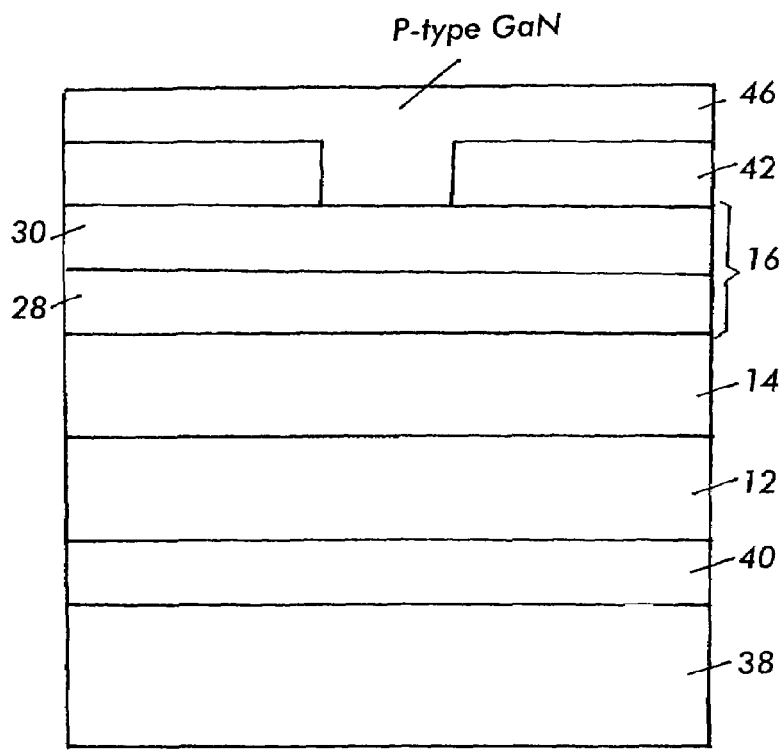
Figure 4D:
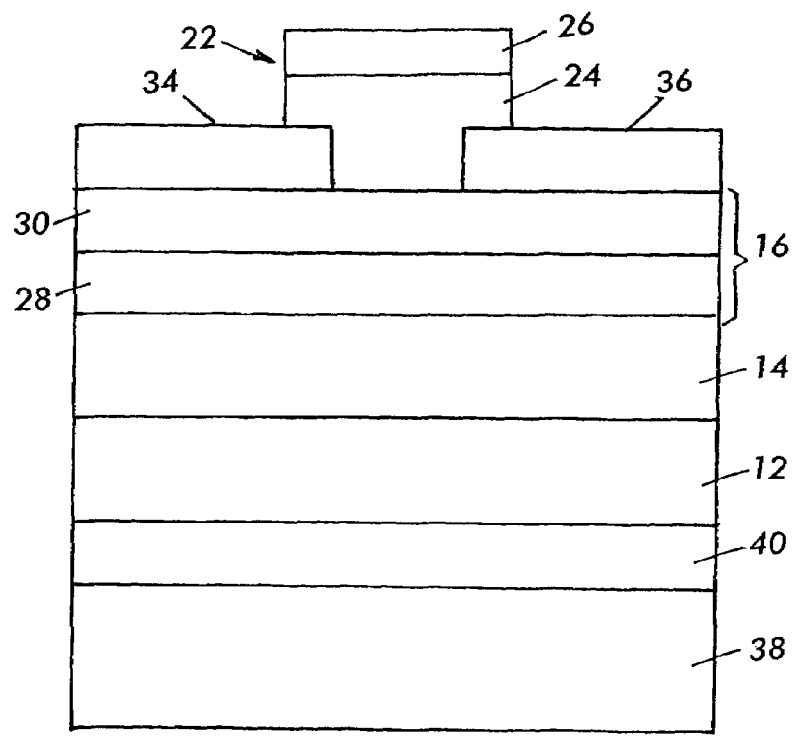

Thereafter, P-type III-nitride 46 (e.g. P-type GaN or P-type AlInGaN) is deposited filling at least opening 44 in body 42 (see FIG. 4C). Then, P-type III-nitride 46 receives material for forming gate electrode 26, and the stack of P-type III-nitride 46 and the gate electrode material is patterned to obtain a gate arrangement 22 as shown by FIG. 4D. The arrangement is then further processed according to any desired method to fabricate first and second power electrodes 18, 20 to obtain device 10 as illustrated by FIG. 1.

Note that N-polar III-nitride GaN can be obtained by growing GaN on a polar substrate such as C polar SiC, or As polar GaAs, resulting in N-polar GaN on the substrate. Alternatively, GaN can be grown on silicon or the like wafer resulting in Galium polar GaN. The Galium polar GaN layer can be then separated through smart cutting. The separated layer can be flipped over to be used as an N-polar material.

The preferred material for spacer field plates 34, 34 is Ge, however, other materials such as $SiO_2$, $Si_3N_4$, $Al_2O_3$, or the like may be used without deviating from the scope and the spirit of the present invention.

Materials for forming gate electrode 26 may be metallic or non-metallic. A non-exhaustive list of materials for forming gate electrode 26 includes TiN, Ti/Al, Ni/Au, Hf, Si, or other Si containing alloys.

Materials for forming first and second power electrodes 18, 20 may be metallic or non-metallic. A non-exhaustive list of materials for forming electrodes 18, 20, 26 includes Ti/Al, Ni/Au, Hf, Si, or other Si containing alloys.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A III-nitride power semiconductor device, comprising:
an N-polar III-nitride body having an N-polar face;
a III-nitride buffer layer on said N-polar face;
a III-nitride heterojunction that includes a III-nitride barrier layer, and a III-nitride channel layer, said III-nitride heterojunction including a two-dimensional electron gas (2DEG) produced over said III-nitride barrier layer;
a first power electrode disposed over said heterojunction and coupled to said 2DEG;
a second power electrode disposed over said heterojunction and coupled to said 2DEG; and
a gate arrangement disposed over said heterojunction between said first and said second power electrode and including a P-type III-nitride body, and a gate electrode, said P-type III-nitride body being disposed between said heterojunction and said gate electrode.

2. The III-nitride device of claim 1, wherein said barrier layer is disposed over said buffer layer and said channel layer is disposed over barrier layer.

3. The III-nitride device of claim 1, wherein said buffer layer is comprised of GaN.

4. The III-nitride device of claim 1, wherein aid barrier layer is comprised of AlInGaN, and aid channel layer is comprised of GaN.

5. The III-nitride device of claim 1, wherein said P-type III-nitride body is comprised of P-type GaN.

6. The III-nitride device of claim 1, wherein mid P-type III-nitride body is comprised of P-type AlInGaN.

7. The III-nitride device of claim 1, further comprising a substrate, and a transition layer disposed between mid substrate and said N-polar III-nitride body.

8. The III-nitride device of claim 7, wherein said transition layer is comprised of AlN.

9. The III-nitride device of claim 7, wherein said transition layer is comprised of an oxide.

10. The III-nitride device of claim 7, wherein said substrate is comprised of one of silicon, SiC, and sapphire.

11. The III-nitride device of claim 1, further comprising a III-nitride substrate, aid N-polar III-nitride body being disposed on said III-nitride substrate.

12. The III-nitride device of claim 1, further comprising a first spacer field plate body disposed between mid first power electrode and said gate arrangement and a second spacer field plate body disposed between said gate arrangement and said second power electrode.

13. The III-nitride device of claim 12, wherein each spacer field plate body is at least partially under a portion of said gate arrangement.

14. The III-nitride device of claim 13, wherein each spacer field plate body is at least partially under a portion of a respective power electrode.

15. The III-nitride device of claim 1, wherein said power electrodes are comprised of one of Ti/Al, Ni/Au, Hf, Si.

16. The III-nitride devices of claim 1, wherein said gate electrode is comprised of one of Ti/Al, Ni/Au, Hf, Si.

17. The III-nitride device of claim 12, wherein said spacer field plate bodies are comprised of one of Ge, $SiO_2$, $Si_3N_4$, and $Al_2O_3$.

18. A III-nitride power semiconductor device, comprising:
an N-polar III-nitride body having an N-polar face;
a III-nitride buffer layer on said N-polar face;
a III-nitride heterojunction that includes a III-nitride barrier layer, and a III-nitride channel layer, said barrier layer and said channel layer having different band gaps or different in-plane lattice constants and said III-nitride heterojunction including a two-dimensional electron gas (2DEG) formed inside said channel layer;
a first power electrode disposed over said heterojunction and coupled to said 2DEG;
a second power electrode disposed over said heterojunction and coupled to said 2DEG; and
a gate arrangement disposed over said hetero unction between said first and said second power electrode and including a P-type III-nitride body, and a gate electrode, said P-type III-nitride body being disposed between said heterojunction and said gate electrode, wherein said barrier layer is disposed over said buffer layer and said channel layer is disposed over barrier layer.

* * * * *

UNITED STATES PATENT AND TRADEMARK OFFICE
CERTIFICATE OF CORRECTION

| | | |
|---|---|---|
| PATENT NO. | : 7,728,355 B2 | Page 1 of 1 |
| APPLICATION NO. | : 11/649014 | |
| DATED | : June 1, 2010 | |
| INVENTOR(S) | : Beach et al. | |

It is certified that error appears in the above-identified patent and that said Letters Patent is hereby corrected as shown below:

In the claims, column 4, line 54, "wherein aid barrier" should be changed to --wherein said barrier--.

In the claims, column 4, line 55, "and aid channel" should be changed to --and said channel--.

In the claims, column 4, line 59, "wherein mid P-type" should be changed to --wherein said P-type--.

In the claims, column 4, line 62, "between mid substrate" should be changed to --between said substrate--.

In the claims, column 5, line 4, "substrate, aid N-polar" should be changed to --substrate, said N-polar--.

In the claims, column 5, line 7, "between mid first" should be changed to --between said first--.

In the claims, column 5, line 8, "arrangement and" should be changed to --arrangement, and--.

In the claims, column 6, line 15, "hetero unction" should be changed to --heterojunction--.

Signed and Sealed this
Twenty-ninth Day of November, 2011

David J. Kappos
*Director of the United States Patent and Trademark Office*